United States Patent
Grimes et al.

(10) Patent No.: US 7,078,924 B2
(45) Date of Patent: Jul. 18, 2006

(54) METHODOLOGY TO ACCURATELY TEST CLOCK TO SIGNAL VALID AND SLEW RATES OF PCI SIGNALS

(75) Inventors: Keith Grimes, Colorado Springs, CO (US); Raymond S. Rowhuff, Wichita, KS (US); William Schmitz, Monument, CO (US)

(73) Assignee: LSI Logic Corporation, Milpitas, CA (US)

( * ) Notice: Subject to any disclaimer, the term of this patent is extended or adjusted under 35 U.S.C. 154(b) by 531 days.

(21) Appl. No.: 10/251,345

(22) Filed: Sep. 20, 2002

(65) Prior Publication Data

US 2004/0059975 A1 Mar. 25, 2004

(51) Int. Cl.
*G01R 31/02* (2006.01)
*G01R 31/26* (2006.01)

(52) U.S. Cl. ........................ 324/763; 324/765
(58) Field of Classification Search ............ None
See application file for complete search history.

(56) References Cited

U.S. PATENT DOCUMENTS

| | | | | |
|---|---|---|---|---|
| 4,588,945 A | * | 5/1986 | Groves et al. | 324/73.1 |
| 4,947,113 A | * | 8/1990 | Chism et al. | 324/754 |
| 4,998,026 A | * | 3/1991 | King | 324/73.1 |
| 5,184,029 A | * | 2/1993 | King | 324/73.1 |
| 5,760,596 A | * | 6/1998 | Peiffer et al. | 324/715 |
| 6,587,965 B1 | * | 7/2003 | Shaeffer et al. | 714/28 |
| 2002/0099980 A1 | * | 7/2002 | Olarig | 714/43 |

* cited by examiner

*Primary Examiner*—Jermele Hollington
(74) *Attorney, Agent, or Firm*—Suiter West Swantz PC LLC

(57) ABSTRACT

A method for populating and depopulating components of negligible impedance facilitates the testing of circuit boards. The test circuitry may be formed upon the circuit board under test. Testing may be performed with great accuracy for the time between the triggering edge of a clock pulse and a resulting valid signal change. Slew rates of bus signals may be more easily measured.

5 Claims, 5 Drawing Sheets

METHODOLOGY TO ACCURATELY TEST CLOCK TO SIGNAL VALID AND SLEW RATES OF PCI SIGNALS

FIELD OF THE INVENTION

The present invention generally relates to the field of circuit testing methods, and particularly to a method of testing clock to signal valid and slew rates of data bus driver signals.

BACKGROUND OF THE INVENTION

Bus driver circuit signal speeds have increased over time, requiring reliable and faster bus signal transitions to a desired voltage level. Bus driver output signals are measured at the time of manufacture, during maintenance, and during troubleshooting to ensure proper circuit performance. The measurements usually require that an external test board be attached to the circuit board upon which the bus driver circuitry is disposed. Connecting wires or lead lines are soldered or otherwise attached and detached between the test board and the circuit board. Test probes are used to make transitory electrical contact with pins or test pads. Test probe use necessitates conveniently located and sized test points on the test board. Proper measurement techniques include isolating the signal under test by taping off certain lead lines. The process is prone to problems with impedance matching and ground loops. The taped off lead lines become stubs and introduce undesirable effects within the circuitry, such as ringing and electromagnetic interference, which affects the accuracy of the measurements. The addition of test probe capacitance, wiring, and external board capacitance compromises the measurements. Furthermore, the current process is time consuming, cumbersome, and poses risks of damage to circuitry on the circuit board under test. Also, test loads have had to include capacitors of smaller value to accommodate the increased speed of performance.

Therefore, it would be desirable to provide a test method for a bus driver signal that accurately and reliably measures signal performance and facilitates connection with an external measurement device.

SUMMARY OF THE INVENTION

Accordingly, the present invention is directed to a method and circuit arrangement in which either of a normal operational mode or a test mode using a test circuit is performed according to the population and depopulation of relevant negligible impedance components.

The present invention relates to a test circuit arrangement on a circuit board that includes a circuit on the circuit board that generates a signal that is received by at least one destination point through a first removable component and a test circuit on the circuit board for evaluating the signal received through a second removable component. Only one of the first and second removable components is installed at any given time. The test circuit may provide a test pad or test point to facilitate probe contact and optional attachment.

The present invention relates to a method for testing a bus driver signal. The method steps include forming a first pair of electrically isolated contact points in the normal operational path of a signal and forming a second removable bridge for transmitting the signal. One end of each of the first and second pairs of electrically isolated contact points is in close proximity to and in electrical connection with a source point of the signal so as to minimize stub length. Included within the method is the step of attaching the other end of the second removable bridge to a first end of a test circuit for testing the signal.

The present invention provides a more accurate, cleaner bus signal in a controlled environment for determining whether an integrated circuit chip is within specified operational parameters, such as clock to signal valid and slew rate. The present method also provides easier probe attachment because there are no external test loads and wires to solder to connect the circuit board to a test board.

It is to be understood that both the forgoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiments of the invention, examples of which are illustrated in the accompanying drawings.

The present invention relates to a method of testing the rise and fall times of a bus signal, such as a Peripheral Component Interconnect (PCI) bus signal, and the circuit arrangement thereof. Removable components of negligible impedance are placed at the generation point of the signal under test and, if installed, pass the bus signal through to either test circuit or normal, operational mode circuitry. The components may preferably be zero ohm resistors. Changing between test modes and the normal operational mode entails populating and depopulating the requisite components. Furthermore, the layout of the circuit board may include minimizing potential stub lengths for unconnected signal path conductive traces and ensuring a maximum signal path from the bus driver to a test pad. The test circuits may only be provided for certain signal lines in the bus.

Figure 1:
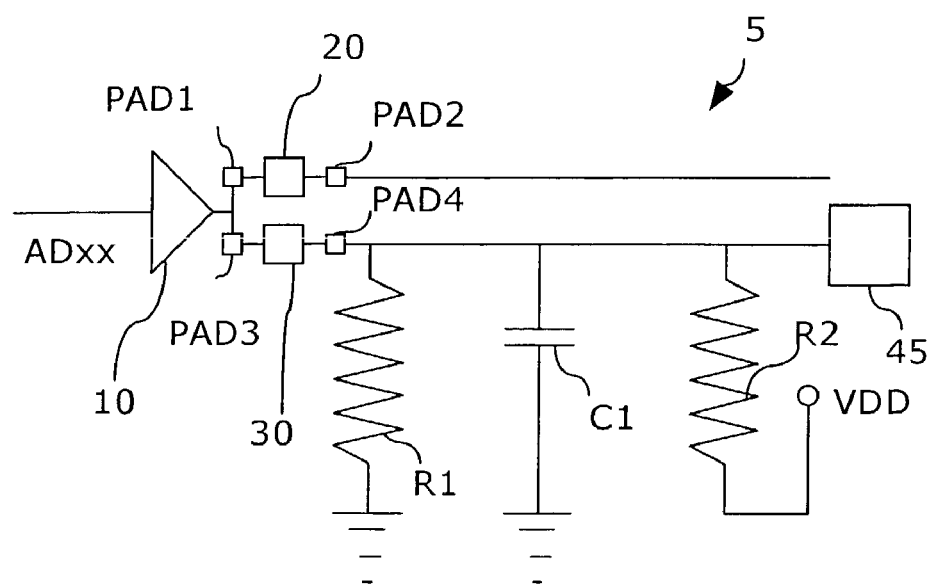
FIG. 1 illustrates a first embodiment of a test circuit of the present invention.

FIG. 1 illustrates an embodiment of a test circuit arrangement of the present invention. The signal buffer 10 provides an output signal that branches through either component terminal PAD1 or PAD2. The component terminals may be surface mount pads, through holes, or other suitable connection point. Removable components of negligible impedance are placed between either PAD1 and PAD2 or between PAD3 and PAD4. The components may be attached to the respective component terminals by solder, conductive adhesive, or other suitable materials. When component 20 is installed, the circuit is in a normal, operational mode. When component 30 is installed, testing of the signal may be performed. The test loads may be realized by a capacitor C1 that removes spikes in the signal and helps set a time constant that affects the rise and fall times of the signal under test to a very limited degree. Resistors R1 and R2 are used to control current flow and help set the RC time constant for rise and fall times, respectively.

Figure 2:
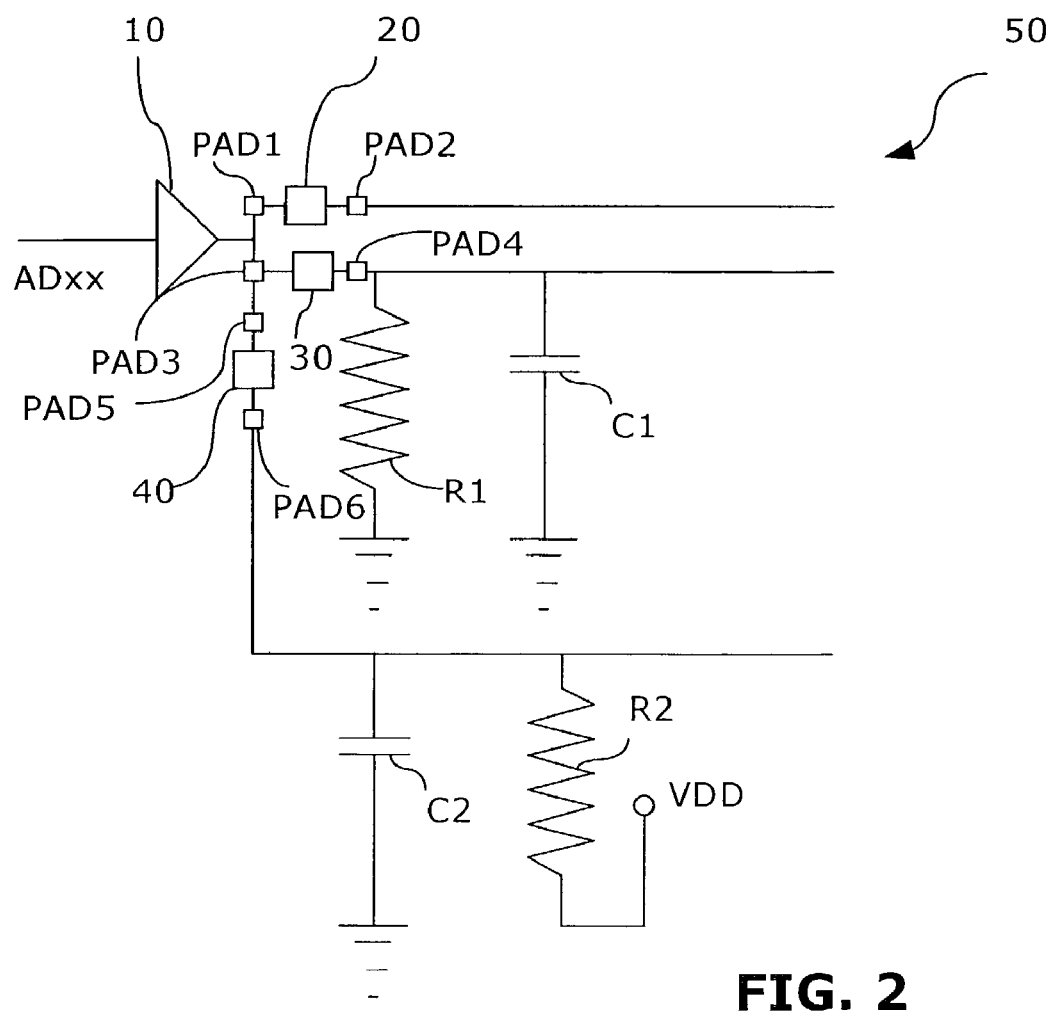
FIG. 2 illustrates a second embodiment of a test circuit of the present invention.
Figure 3:
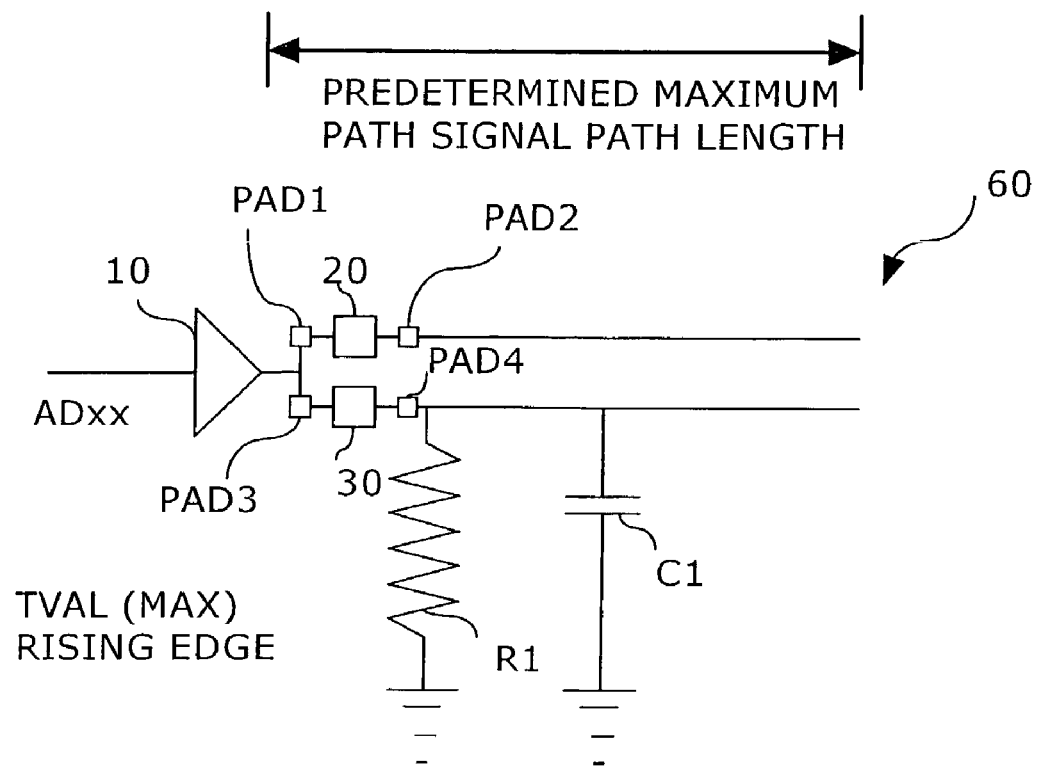
FIG. 3 illustrates a third embodiment of a test circuit of the present invention.
Figure 4:
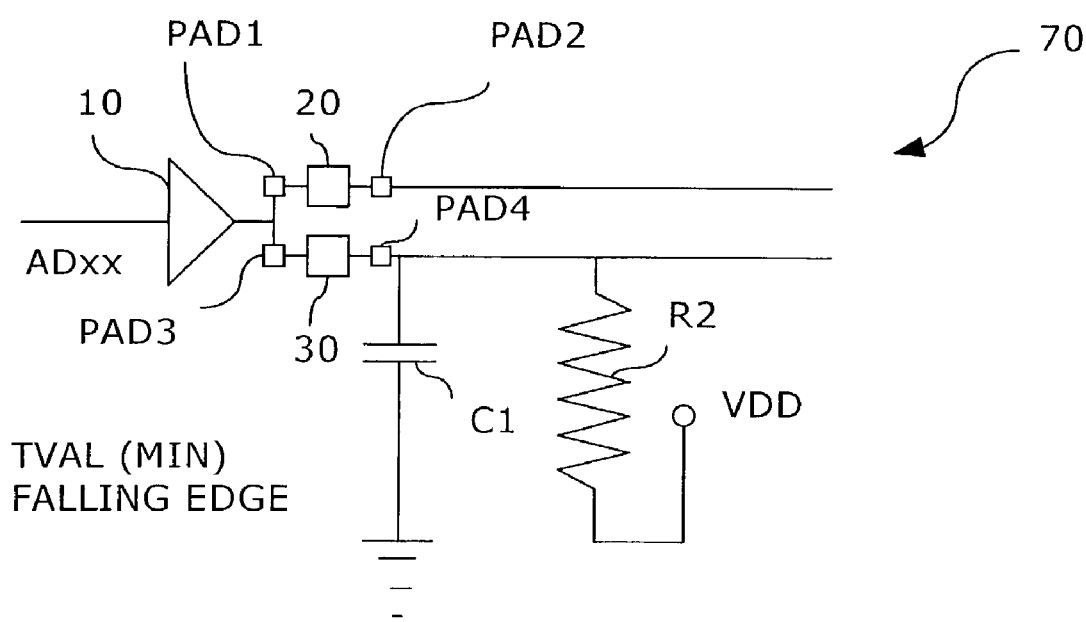
FIG. 4 illustrates a fourth embodiment of a test circuit of the present invention.

FIGS. 2–4 illustrate various alternative embodiments of test circuitry arrangements. FIG. 2 illustrates the use of three removable components 20, 30, 40 to set a normal, operational mode; a signal rise time test; or a signal fall time test, respectively. Because of the anticipated speed of the signals of the circuitry under test, it is critical to limit the propagation delay of the signal to a value as low as possible. It is also important to limit the range of propagation delays of the signal to accurately assess the performance of the circuitry generating the signal. The selection of the load resistors and capacitors and the total signal path length from the point of generation to the test pad 45 determine the overall signal propagation delay. The RC time constant, determined by the product of resistor R1 and capacitor C1 or the product of resistor R2 and capacitor C2, represents the time for the signal to reach approximately 63% of the maximum (or, minimum) signal value. Two RC time constants represent the time for the signal to reach approximately 87% of the maximum (or, minimum) signal value. For example, if R1 is a 25 ohm resistor and C1 is a 10 pFd capacitor, then the RC time constant is 0.25 nanoseconds. The exemplary embodiments shown in FIGS. 1–4 of the present invention are to be practiced with a predetermined maximum signal path length from the point of buffer 10 where the signal is generated to a test point 45. This predetermined maximum signal path length may be 0.5 inches. A 0.5 inch signal path length is approximately equal to 0.05 nanoseconds of propagation delay. Thus, the overall time delay in a test circuit, such as in FIGS. 2–4, is about 0.55 nanoseconds for the signal to undergo an approximately 87% change in value. Precision resistors and precision capacitors may be used for R1, R2, C1, and C2 to ensure precise measurements. The resistors and capacitors may be discrete components or may be built into the printed circuit board (PCB). For example the capacitor may be formed from an island of metallization over a dielectric layer that is over a ground plane within the PCB and the resistor may be formed by laser trimming.

Figure 5:
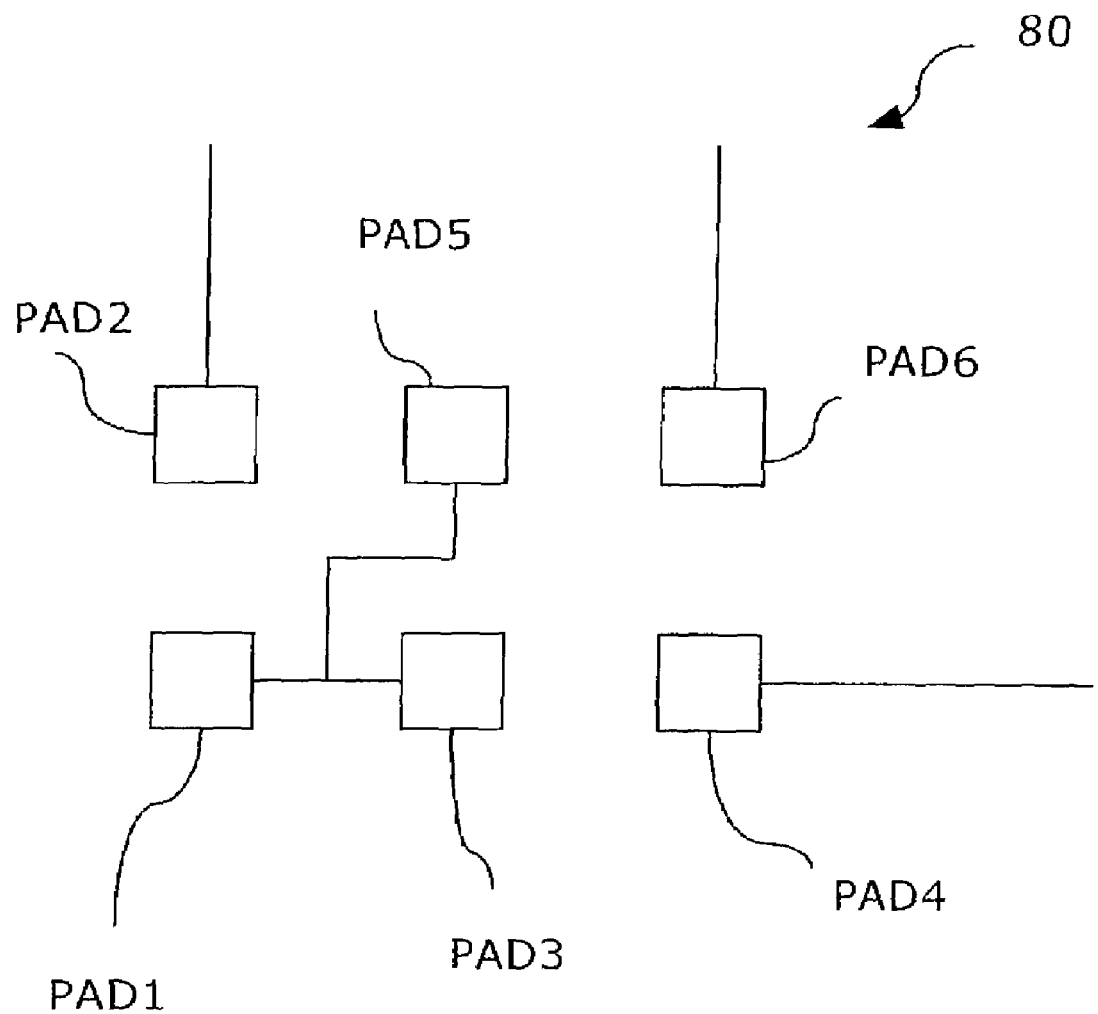
FIG. 5 illustrates an exemplary arrangement of the negligible impedance components' connection terminals of the present invention.

The connection terminals for the removable components of negligible impedance may be arranged in a variety of configurations. FIG. 5 illustrates an exemplary configuration of connection terminals for the removable components of negligible impedance. Only one removable component may be installed at any time. In the example, component 20 may be installed across connection terminals PAD1 and PAD2, component 30 across connection terminals PAD3 and PAD4, or component 40 across connection terminals PAD5 and PAD6. Connection terminals PAD1, PAD3, and PAD5 may be arranged so as to be equidistant from the generation point of the signal under test. Alternatively, the design of the conductive traces may restrict all signal paths to a predetermined length within a set tolerance.

Figure 6:
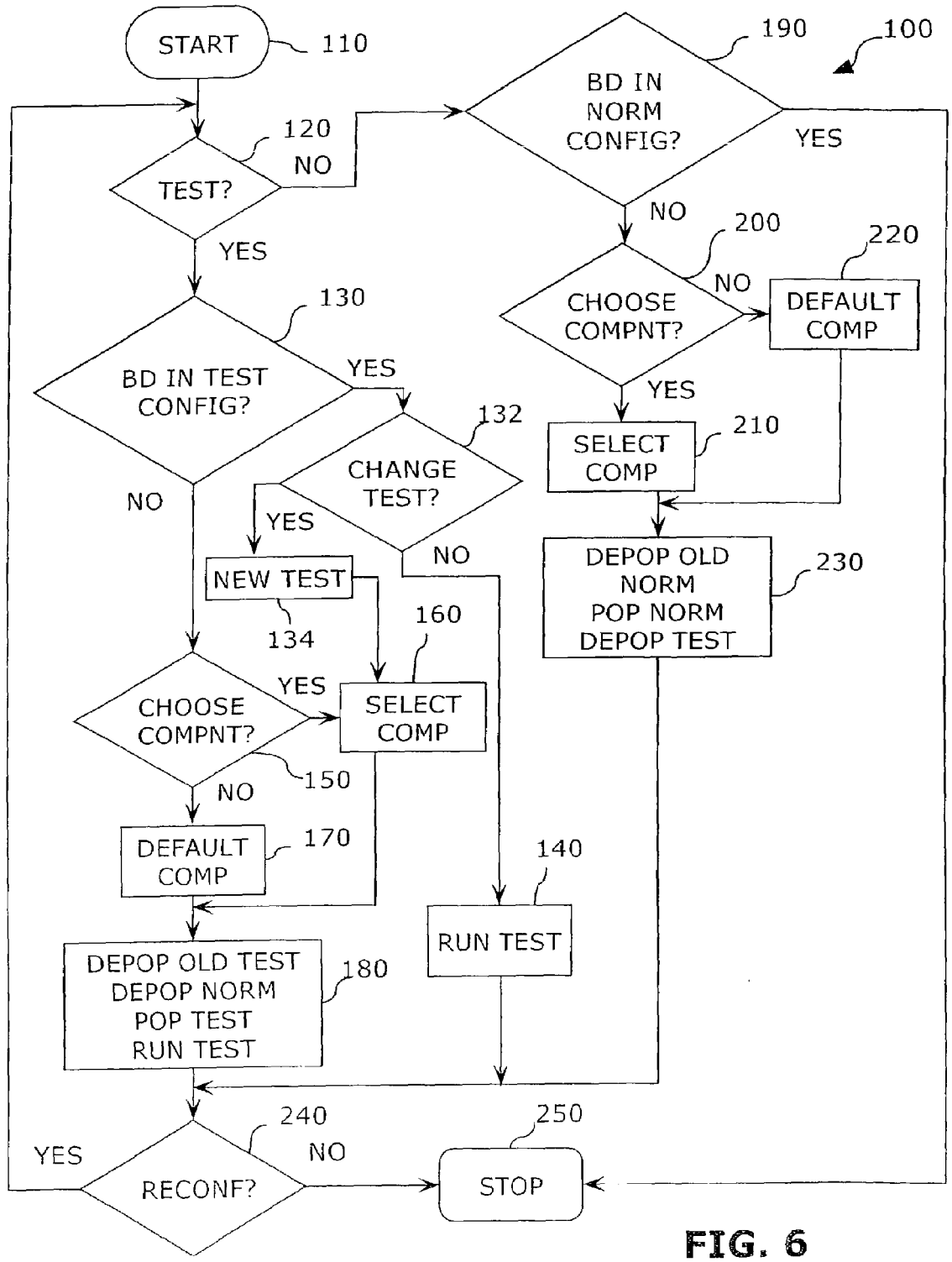
FIG. 6 illustrates a method of the present invention.

FIG. 6 illustrates an embodiment of a method of the present invention for measuring the rise and fail times of a bus driver signal. These measurements may also include the time for clock to signal valid and the slew rate. The method may be fully automated, partly manual, or entirely manual. The method may be practiced through a program accessible through a graphical user interface (GUI). The following steps are meant to provide a general description of the steps in preparing a circuit board to be tested. If processing is entirely manual, a computer program and GUI need not be used.

A user may select if a test is to be performed, per step 120. If normal mode is opted, the user or a processor indicates 190 if the circuit board is in normal configuration. If the circuit board is in normal configuration, then processing stops 250. If the circuit board is not in normal, operational configuration, a component may be selected 200. The component may be selected by default 220 or by user or processor determination 210. For instance, a user may be prompted through the GUI as to whether the negligible impedance components 20, 30, and 40 in the test circuitry are to be changed through the GUI or other manner. After component selection, the old normal mode negligible impedance components are depopulated, the test mode negligible impedance components are depopulated, and the selected negligible impedance components for normal mode are populated 230.

If a determination 120 is made to enter a test mode for the circuit board, a determination is made as to whether the circuit board is already in a test configuration 130. If the circuit board is determined to be in a test configuration, then a determination is made as to whether the test is to be changed 132. For example, a processor using a test history of the circuit board from a storage device may make this determination. For an unchanged test mode, the testing is conducted 140 and then a decision is to be made as to whether the circuit board is to be reconfigured 240. If the test mode is changed, a new test is conducted 134 in which negligible impedance components are selected 160, the old test negligible impedance components are removed, any normal mode negligible impedance components are also removed, the new test negligible impedance components are populated, and the test is run 180. If test mode is chosen 120 and the circuit board is not configured for testing 130, a determination is made as to whether default negligible impedance components are to be used 170 or if selected negligible impedance components are to be used 160. In addition or as an alternative, the resistors, capacitors, and other components of the test circuit may be populated or depopulated, as desired. Then, if necessary, old test negligible impedance components are depopulated. Any existing normal, operational mode negligible impedance components are depopulated. The new test negligible impedance components are populated and the circuit board is tested 180. Again, processing returns to a determination as to whether to reconfigure the circuit board 240. If the circuit board is to be reconfigured, processing proceeds to step 120; otherwise, processing stops 250.

Although the negligible impedance components of the present invention may be capacitive, inductive, and/or resistive, purely resistive elements are preferred. More preferably, zero ohm resistors may be used. Zero ohm resistors have the general appearance of a resistor, but usually are limited in color coding to a single color band (e.g., a thin black band). Zero ohm resistors are especially useful for automatic placement machines because they are physically configured to facilitate automatic attachment and removal. These resistors are also capable of manual placement. Zero ohm resistors generally have a maximum resistance of under ½ ohm under a prescribed operational range (e.g., temperature).

Figure 7:
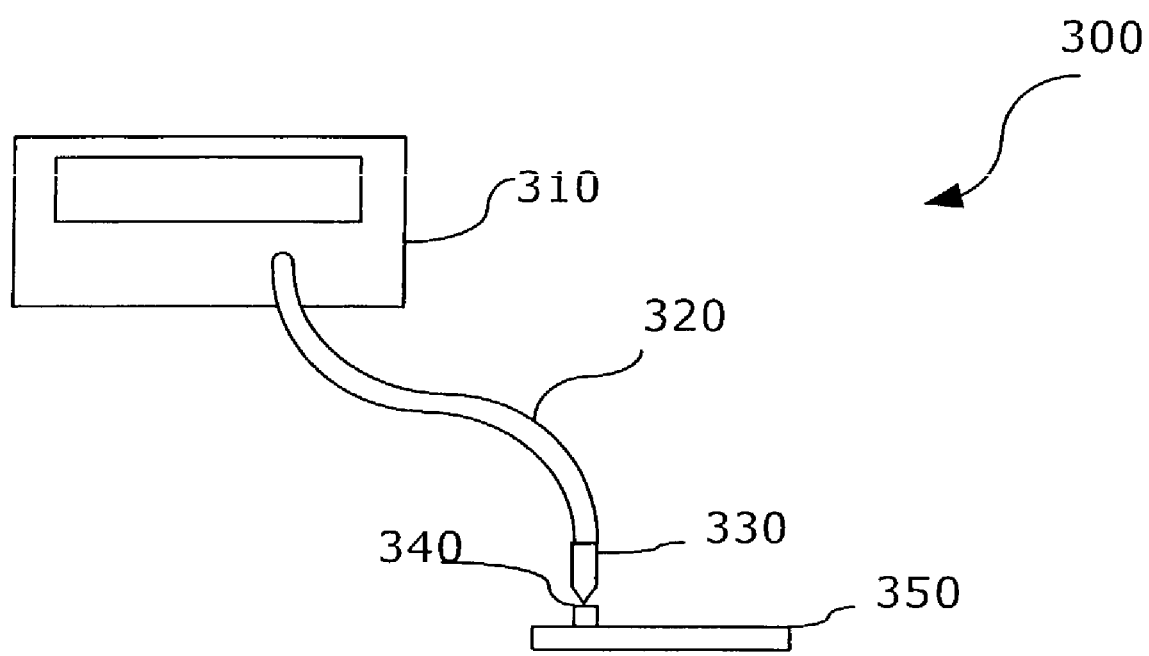
FIG. 7 illustrates an exemplary test setup useable with the present invention.

FIG. 7 illustrates an exemplary test setup 300 useable with the present invention. A logical analyzer, oscilloscope, or other waveform measuring device 310 provides a visual readout of the measurement information collected from probe 330 through probe lead line 320. The probe tip contacts the test point or pad 340. The probe 330 may have an alligator clip or other fastening attachment to secure to the test point 340. The size of test point 340 is shown as exaggerated upon the circuit board 350 to which it is mounted. The point may be a flat conductive pad, a conductive post (e.g., a pin) extending substantially vertically from the circuit board 350, etc. Other test setups are contemplated by the present invention. For example, an automated testing system may populate and depopulate relevant components, extend and retract probes, and record measurement data.

It is believed that the present invention and many of its attendant advantages will be understood by the forgoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof. It is the intention of the following claims to encompass and include such changes.

What is claimed is:

1. A method for configuring a bus driver circuit for testing, comprising the steps of:
   providing a connectable first path at or near a bus driver output for a normal, operational mode on a circuit board;
   providing a connectable second path at or near the bus driver output for a test mode performed by a test circuit on the circuit board; and
   physically installing a bridging component of negligible impedance at one of the connectable first and second paths,
   wherein the bridging component of negligible impedance is a zero ohm resistor.

2. The method of claim 1, wherein the zero ohm resistor is surface mounted.

3. A system for measuring the rise and fall times of a bus driver signal, comprising:
   a circuit board having a bus driver circuit for generating a bus driver signal and a test circuit capable of being coupled to the bus driver circuit, the test circuit having a test point, the bus driver signal propagating through one of a first connectable path for a normal, operational mode and a second connectable path to the test circuit for a test mode; and
   a measuring device having a probe that makes electrical contact with the test point of the test circuit,
   wherein one of the first and second connectable paths is connected by the physical installation of a component of negligible impedance, and
   wherein the component of negligible impedance is a zero ohm resistor.

4. A system for measuring the rise and fall times of a bus driver signal, comprising:
   a circuit board having a bus driver circuit for generating a bus driver signal and a test circuit capable of being coupled to the bus driver circuit, the test circuit having a test point, the bus driver signal propagating through one of a first connectable path for a normal, operational mode and a second connectable path to the test circuit for a test mode; and
   a measuring device having a probe that makes electrical contact with the test point of the test circuit,
   wherein one of the first and second connectable paths is connected by the physical installation of a component of negligible impedance, and
   wherein the rise time of the driver bus signal is measured in the test circuit in which the test circuit has a pull down resistor and a capacitor.

5. A system for measuring the rise and fall times of a bus driver signal, comprising:
   a circuit board having a bus driver circuit for generating a bus driver signal and a test circuit capable of being coupled to the bus driver circuit, the test circuit having a test point, the bus driver signal propagating through one of a first connectable path for a normal, operational mode and a second connectable path to the test circuit for a test mode; and
   a measuring device having a probe that makes electrical contact with the test point of the test circuit,
   wherein one of the first and second connectable paths is connected by the physical installation of a component of negligible impedance, and
   wherein the fall time of the driver bus signal is measured in the test circuit in which the test circuit has a pull up resistor and a capacitor.

* * * * *